US007893780B2

(12) United States Patent
Bulatowicz et al.

(10) Patent No.: US 7,893,780 B2
(45) Date of Patent: Feb. 22, 2011

(54) REVERSIBLE ALKALI BEAM CELL

(75) Inventors: Michael D. Bulatowicz, Canoga Park, CA (US); Michael S. Larsen, Woodland Hills, CA (US)

(73) Assignee: Northrop Grumman Guidance and Electronic Company, Inc., Los Angeles, CA (US)

( * ) Notice: Subject to any disclaimer, the term of this patent is extended or adjusted under 35 U.S.C. 154(b) by 38 days.

(21) Appl. No.: 12/481,709

(22) Filed: Jun. 10, 2009

(65) Prior Publication Data

US 2009/0309668 A1 Dec. 17, 2009

Related U.S. Application Data

(60) Provisional application No. 61/073,197, filed on Jun. 17, 2008.

(51) Int. Cl.
*H03L 7/26* (2006.01)
*H03B 17/00* (2006.01)

(52) U.S. Cl. .......................................... 331/94.1; 331/3

(58) Field of Classification Search ................ 331/94.1, 331/3
See application file for complete search history.

(56) References Cited

U.S. PATENT DOCUMENTS 3,418,565 A 12/1968 Broussaud et al.
3,450,876 A 6/1969 Kern et al.
3,519,949 A 7/1970 Marlnar et al.
3,645,599 A 2/1972 Van Bragt
4,146,848 A * 3/1979 Hellwig et al. ................. 331/3
4,953,148 A 8/1990 Lepek et al.
5,107,226 A 4/1992 Pascaru
5,153,679 A 10/1992 Gilby
5,192,921 A 3/1993 Chantry et al.
5,420,549 A * 5/1995 Prestage .................... 331/94.1

(Continued)

FOREIGN PATENT DOCUMENTS

EP 0 422 448 A2 4/1991
EP 0 550 240 A1 7/1993

OTHER PUBLICATIONS

Roach Timothy et al.: "*Novel Rubidium Atomic Beam with an Alkali Dispenser Source*"; Journal of Vacuum Science and Technology: Part A, AVS/AIP, Melville, NY, US LNKD-DOI: 10.1116/1.1806440, vol. 22, No. 6, Oct. 20, 2004, pp. 2384-2387, XP012073913, ISSN: 0734-2101; *p. 2384; figure 1*.

(Continued)

*Primary Examiner*—Joseph Chang
(74) *Attorney, Agent, or Firm*—Tarolli, Sundheim, Covell & Tummino LLP

(57) ABSTRACT

One embodiment of the invention includes an alkali beam cell system that comprises a reversible alkali beam cell. The reversible alkali beam cell includes a first chamber configured as a reservoir chamber that is configured to evaporate an alkali metal during a first time period and as a detection chamber that is configured to collect the evaporated alkali metal during a second time period. The reversible alkali beam cell also includes a second chamber configured as the detection chamber during the first time period and as the reservoir chamber during the second time period. The reversible alkali beam cell further includes an aperture interconnecting the first and second chambers and through which the alkali metal is allowed to diffuse.

23 Claims, 6 Drawing Sheets

U.S. PATENT DOCUMENTS

| | | | | |
|---|---|---|---|---|
| 6,900,702 | B2 | 5/2005 | Youngner et al. | |
| 7,030,704 | B2 | 4/2006 | White | |
| 7,102,451 | B2 | 9/2006 | Happer et al. | |
| 7,292,111 | B2 | 11/2007 | Abbink et al. | |
| 2005/0007118 | A1 | 1/2005 | Kitching et al. | |
| 2005/0184815 | A1 | 8/2005 | Lipp et al. | |
| 2009/0058545 | A1 * | 3/2009 | Prestage et al. | 331/94.1 |

OTHER PUBLICATIONS

Vanier J: "*Atomic Clocks Based on Coherent Population Trapping: A Review*"; Applied Physics B; Lasers and Optics, Springer, Berlin DE, LNKD-DOI: 10.1007/S00340-005-1905-3, vol. 81, No. 4, Aug. 1, 2005, pp. 421-442, XP019337502 ISSN: 1432-0649; *pp. 424-425, figures 3, 6*.

* cited by examiner

REVERSIBLE ALKALI BEAM CELL

RELATED APPLICATIONS

The present invention claims priority from U.S. Provisional Patent Application No. 61/073,197, filed Jun. 17, 2008.

TECHNICAL FIELD

The present invention relates generally to beam cell systems, and specifically to a reversible alkali beam cell.

BACKGROUND

Alkali beam cells can be utilized in various systems which require extremely accurate and stable frequencies, such as alkali beam atomic clocks. As an example, alkali beam atomic clocks can be used in bistatic radar systems, global positioning systems (GPS), and other navigation and positioning systems, such as satellite systems. Atomic clocks are also used in communications systems, such as cellular phone systems.

An alkali beam cell typically contains an alkali metal. For example, the metal can be Cesium (Cs). Light from an optical source can pump the atoms of an evaporated alkali metal from a ground state to a higher state, from which they can fall to a different hyperfine state. An interrogation signal, such as a microwave signal, can then be applied to the alkali beam cell and an oscillator controlling the interrogation signal can be tuned to a particular frequency so as to maximize the repopulation rate of the initial ground state. In this manner, a controlled amount of the light can be propagated from the alkali beam cell and can be detected, such as by a photodetector.

By examining the output of the detection device, a control system can provide various control signals to the oscillator and light source to ensure that the wavelength of the propagated light and microwave frequency are precisely controlled, such that the microwave input frequency and hyperfine transition frequency are substantially the same. The oscillator thereafter can provide a highly accurate and stable frequency output signal for use as a frequency standard or atomic clock.

Based on the applications in which an alkali beam cell can be used, there is a demand for reducing the size without affecting the operating life of the alkali beam cell. For example, because associated atomic clocks can be implemented in satellite applications, atomic clocks are typically desired to be small to reduce payload, and to have long operating life because they cannot easily be replaced. However, with regard to typical alkali beam cells, such concepts can be mutually exclusive. Specifically, in a typical alkali beam cell, more alkali metal can be required to increase the operating life of the alkali beam cell. However, increasing the amount of the alkali metal can require a larger alkali beam cell.

SUMMARY

One embodiment of the invention includes an alkali beam cell system that comprises a reversible alkali beam cell. The reversible alkali beam cell includes a first chamber configured as a reservoir chamber that is configured to evaporate an alkali metal during a first time period and as a detection chamber that is configured to collect the evaporated alkali metal during a second time period. The reversible alkali beam cell also includes a second chamber configured as the detection chamber during the first time period and as the reservoir chamber during the second time period. The reversible alkali beam cell further includes an aperture interconnecting the first and second chambers and through which the alkali metal is allowed to diffuse.

Another embodiment of the invention includes an alkali beam atomic clock system. The alkali beam atomic clock system includes a reversible alkali beam cell comprising a first chamber, a second chamber, and an aperture interconnecting the first and second chambers and through which an alkali metal is allowed to diffuse. The first chamber can be configured as a reservoir chamber configured to evaporate the alkali metal and the second chamber can be configured as a detection chamber being configured to collect the evaporated alkali metal during a first time period. The second chamber can be configured as the reservoir chamber and the first chamber being configured as the detection chamber during a second time period. The alkali beam atomic clock system also comprises at least one heating element configured to heat the reservoir chamber during each of the first and second time periods. The alkali beam atomic clock further comprises a clock controller configured to generate a clock signal that is locked to a hyperfine transition frequency of the evaporated alkali metal in the detection chamber.

Another embodiment of the invention includes a method for controlling an alkali beam atomic clock. The method includes applying heat to an alkali beam cell to evaporate an alkali metal and to generate a pressure difference between a first chamber configured as a reservoir chamber and a second chamber configured as a detection chamber. The method also includes pumping optical energy into the second chamber to transition the evaporated particles of the alkali metal to a desired hyperfine state to prepare the alkali beam for interrogation. The method also includes applying an interrogation signal to the alkali beam and obtaining a frequency reference based on the interrogation signal. The method also includes reversing the alkali beam cell such that the first chamber is configured as the detection chamber and the second chamber is configured as the reservoir chamber. The method further includes repeating the steps of applying heat, pumping optical energy, applying the interrogation signal, and obtaining the frequency reference.

DETAILED DESCRIPTION

The present invention relates generally to beam cell systems, and specifically to a reversible alkali beam cell. A reversible alkali beam cell, such as can be implemented in an atomic clock, includes a first chamber and a second chamber, as well as an aperture that interconnects the first and second chambers. During a first operational time period of the reversible alkali beam cell, the first chamber can be configured as a reservoir chamber that holds and evaporates an alkali metal, such as Cesium (Cs), and the second chamber can be configured as a detection chamber which collects the evaporated alkali metal. During a second operational time period, the first chamber and the second chamber can switch roles. As such, during the second operational time period, the second chamber can be configured as the reservoir chamber that holds and evaporates the alkali metal and the first chamber can be configured as the detection chamber which collects the evaporated alkali metal.

The transition between the first and second time periods can occur at a time when the alkali metal is almost completely depleted from the reservoir chamber. As such, most of the alkali metal is in the detection chamber just prior to the transition. As a result, the chamber which was previously the detection chamber becomes the new reservoir chamber, and vice-versa. The reversible alkali beam cell can be implemented in an atomic clock. For example, two reversible alkali beam cells can be implemented and operating in parallel and out-of-phase with respect to each other. Both of the reversible alkali beam cells can be tuned to provide the same timing reference to the atomic clock substantially concurrently. As a result, when one of the reversible alkali beam cells reverses the reservoir and detection chambers, the other reversible alkali beam cell continues to provide the timing reference to the atomic clock uninterrupted. As a result, the atomic clock can maintain a stable and accurate time even during the chamber-reversing transition of one of the reversible alkali beam cells.

Figure 1:
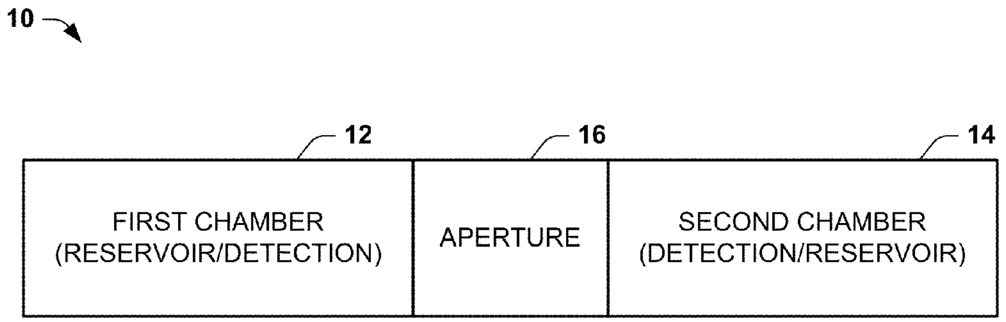
FIG. 1 illustrates an example of a diagram of a reversible alkali beam cell in accordance with an aspect of the invention.

FIG. 1 illustrates an example of a diagram of an alkali beam cell 10 in accordance with an aspect of the invention. As an example, the alkali beam cell 10 can be implemented in an alkali beam atomic clock, such as could be utilized in a satellite application or any of a variety of other applications that require precise timing, small size, and a long operational life. The alkali beam cell 10 includes a first chamber 12, a second chamber 14, and an aperture 16 that interconnects the first and second chambers 12 and 14. As an example, each of the first and second chambers 12 and 14 can be configured as glass chambers, such as fabricated from Pyrex®, and the aperture 16 can be configured as one or more holes that connect the first and second chambers 12 and 14. Thus, the alkali beam cell 10 can be completely sealed. As described in greater detail below, the aperture 16 can be designed in any of a variety of ways to influence the velocity profile of an evaporating alkali metal that is contained within the alkali beam cell 10.

In the example of FIG. 1, the first chamber 12 is demonstrated as a reservoir/detection chamber and the second chamber 14 is demonstrated as a detection/reservoir chamber. Thus, at a given period of time, one of the first chamber 12 and the second chamber 14 is configured as a reservoir chamber for holding and evaporating an alkali metal, such as Cesium (Cs), and the other of the first chamber 12 and the second chamber 14 is configured as a detection chamber which collects the evaporated alkali metal and through which the frequency reference is determined. However, because the alkali beam cell 10 is reversible, the roles of the first chamber 12 and the second chamber 14 can be switched. As a result, after the first chamber 12 is configured as the reservoir chamber and the second chamber 14 is configured as the detection chamber during a first time period, the second chamber 14 can be configured as the detection chamber and the first chamber can be configured as the reservoir chamber during a second time period.

As an example, the first chamber 12 can initially be configured as a reservoir chamber that initially stores a predetermined amount of alkali metal. As such, the second chamber 14 can initially be configured as a detection chamber. External heating sources (not shown) can apply heat to the aperture 16 and to the first chamber 12, such as along the side-walls of the first chamber 12. Therefore, the aperture 16 can be the hottest part of the alkali beam cell 10, the side-walls of the first (i.e., reservoir) chamber 12 and the second (i.e., detection) chamber 14 can be slightly cooler than the aperture 16, the end-wall of the first chamber 12 farthest from the aperture 16 can be cooler than the side-walls first chamber 12, and the end-wall of the second chamber 14 farthest from the aperture 16 can be the coolest point on the alkali beam cell 10. As a result, the manner in which the alkali beam cell 10 is heated causes a pressure difference in the alkali beam cell 10 from the first chamber 12 to the second chamber 14 with respect to the evaporated alkali metal. Accordingly, the evaporated particles of the alkali metal can travel from the first chamber 12 through the aperture 16 at a substantially constant rate in a highly predictable manner and having a controlled velocity profile into the second chamber 14. Thus, an alkali metal beam is formed in the second chamber 14, which can be pumped, interrogated with a signal, and probed optically and/or optically and with a microwave cavity to establish a frequency reference, such as can be implemented for an alkali beam atomic clock.

Upon a substantial portion of the alkali metal in the first chamber 12 having been evaporated and collected in the second chamber 14, an associated controller (not shown) can switch the roles of the first and second chambers 12 and 14. Therefore, the second chamber 14 can initially be configured as the reservoir chamber and the first chamber 12 can be configured as the detection chamber. As an example, the associated controller can reverse the heating of the first and second chambers 12 and 14. As such, the aperture 16 can remain the hottest part of the alkali beam cell 10, the side-walls of the second (i.e., reservoir) chamber 14 and the first (i.e., detection) chamber 12 can be slightly cooler than the aperture 16, the end-wall of the second chamber 14 farthest from the aperture 16 can be cooler than the side-walls second chamber 14, and the end-wall of the first chamber 12 farthest from the aperture 16 can be the coolest point on the alkali beam cell 10. As a result, the pressure difference in the alkali beam cell 10 switches with respect to the evaporated alkali metal from the second chamber 14 to the first chamber 12. Accordingly, the evaporated particles of the alkali metal can now travel from the second chamber 14 through the aperture 16 at the substantially constant rate into the first chamber 12. Thus, the alkali metal beam is now formed in the first chamber 12, which can be pumped, interrogated with a signal, and probed optically and/or optically and with a microwave cavity to establish the frequency reference.

Figure 2:
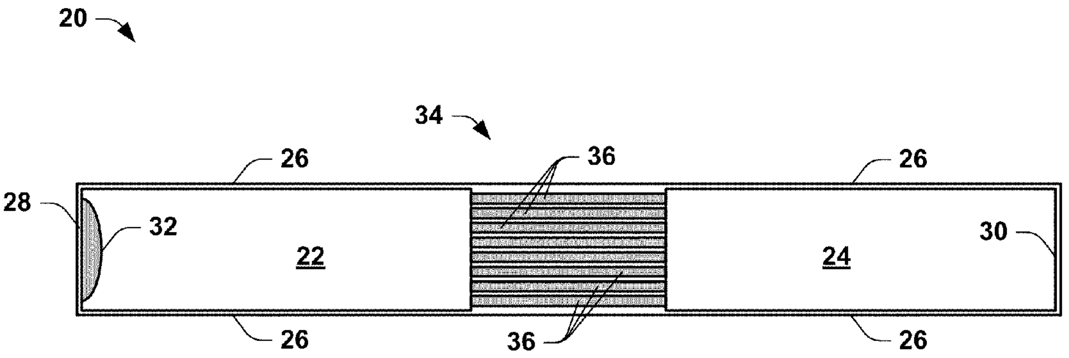
FIG. 2 illustrates an example of an alkali beam cell in accordance with an aspect of the invention.

FIG. 2 illustrates an example of an alkali beam cell 20 in accordance with an aspect of the invention. The alkali beam cell 20 can correspond to the diagram of the alkali beam cell 10 in the example of FIG. 1. Therefore, reference is to be made to the example of FIG. 1 in the example of FIG. 2.

The alkali beam cell 20 includes a first chamber 22 and a second chamber 24. Each of the first chamber 22 and the second chamber 24 are demonstrated in the example of FIG. 2 as being enclosed in glass side-walls 26, with the first chamber 22 having a glass end-wall 28 and the second chamber 24 having a glass end-wall 30. Therefore, the first chamber 22 and the second chamber 24 are each substantially enclosed. The glass side-walls 26 can be any of a variety of shapes, such as planar to form a prismatic shape of the first and second chambers 22 and 24, with at least one of the surfaces of the glass side-walls being substantially transparent. A predetermined amount of an alkali metal 32, such as Cs, is deposited onto the inner surface of the glass end-wall 28. Accordingly, as demonstrated in the example of FIG. 2, the first chamber 22 can correspond to a reservoir chamber and the second chamber 24 can correspond to a detection chamber.

The alkali beam cell 20 also includes an aperture section 34. The aperture section 34 includes a plurality of tubes 36 that are arranged in a straight and parallel manner with respect to each other and to a central axis that extends through both the first and second chambers 22 and 24. As demonstrated in the example of FIG. 2, the tubes 36 couple the first and second chambers 22 and 24 together, such that the tubes 36 can have opposing openings at each of the first and second chambers 22 and 24, respectively. As a result, the first and second chambers 22 and 24 and the tubes 36 can define an enclosed volume that constitutes the alkali beam cell 20.

It is to be understood that the tubes 36 are not intended to be limited to being straight and parallel, but could have any of a variety of shapes to influence the velocity profile of evaporated alkali metal. For example, the tubes 36 could be nonlinear, or could have axes that are not parallel with respect to the central axis that extends through the first and second chambers 22 and 24. As another example, the tubes 36 can be tapered with respect to openings at the first chamber 22 and openings at the second chamber 24, such that the tubes 36 have longitudinally dependent cross-sectional areas. For example, a given tube 36 can have a small opening at the first chamber 22, such that each of the tubes 36 that are adjacent to it can have large openings at the first chamber 22, with the openings at the opposite end of the tube, at the second chamber 24, being opposite in size. Likewise, a given tube 36 can have a large opening at the first chamber 22, such that each of the tubes 36 that are adjacent to it can have small openings at the first chamber 22, with the openings at the opposite end of the tube, at the second chamber 24, being opposite in size.

Similar to as described above, the first chamber 22 and the second chamber 24 can each correspond to a reservoir chamber and a detection chamber, respectively, at a given time period. As described above, because the alkali metal 32 is deposited in the first chamber 22, the first chamber 22 is demonstrated in the example of FIG. 2 as the reservoir chamber and the second chamber 24 is demonstrated as the detection chamber. However, because the alkali beam cell 20 is reversible, the second chamber 24 could become the reservoir chamber and the first chamber 22 could become the detection chamber upon the alkali metal 32 being substantially evaporated and collected in the second chamber 24.

In the example of FIG. 2, the first and second chambers 22 and 24 can be configured as having substantially equal dimensions with respect to each other. Therefore, the controlled rate of evaporation of the particles of the alkali metal 32 from the reservoir chamber to the detection chamber can be maintained substantially the same regardless of the respective roles of the first and second chambers 22 and 24. Accordingly, under substantially the same heating conditions applied to the alkali beam cell 20, the alkali metal 32 can provide an approximately uniform frequency reference associated with the alkali beam of the alkali beam cell 20 regardless of the respective roles of the first and second chambers 22 and 24.

The construction of the alkali beam cell 20 can be such that a precise alkali beam atomic clock can be constructed to provide extremely accurate timing, such as having an error of less than one second over hundreds or even thousands of years. However, because the alkali beam cell 20 is reversible, the alkali beam cell 20 can have an operating life that is substantially indefinite, as it can continue to be reversed to switch the alkali metal 32 between the first and second chambers 22 and 24. In addition, because the alkali beam cell 20 has an operating life that is substantially indefinite, it can be configured to be significantly small compared to conventional beam cells (e.g., 5 cm or less). Specifically, because the operating life of the alkali beam cell 20 is substantially indefinite, the operating life of the alkali beam cell 20 is not limited by a quantity of the alkali metal 32. Therefore, the alkali beam cell 20 is not constrained in size based on requiring larger quantities of the alkali metal 32 to extend the operating life. Accordingly, the alkali beam cell 20 can be configured in a substantially small form-factor, such as to conserve weight and size in restrictive applications, such as on a satellite.

It is to be understood that the alkali beam cell 20 is not intended to be limited to the example of FIG. 2. As an example, the alkali beam cell 20 can be configured in any of a variety of shapes and dimensions. In addition, as described above, the tubes 36 can be configured in any of a variety of ways to accurately control the velocity profile of the evaporated particles of the alkali metal 32. Accordingly, the alkali beam cell 20 can be configured in any of a variety of ways.

Figure 3:
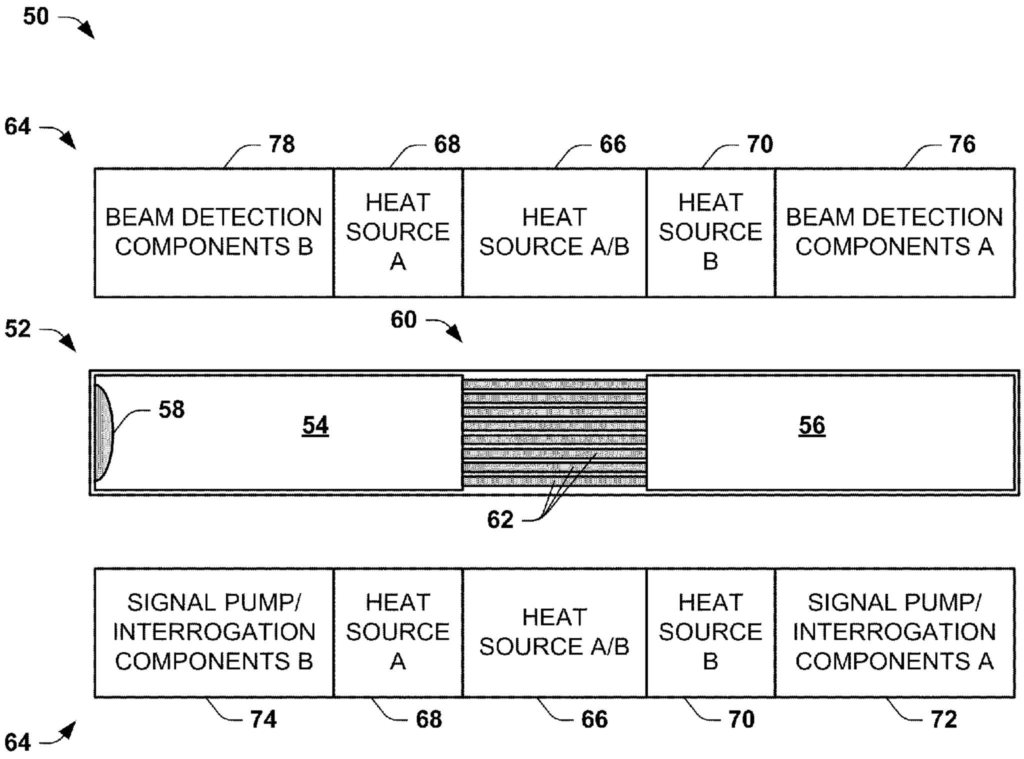
FIG. 3 illustrates an example of an alkali beam cell system in accordance with an aspect of the invention.

FIG. 3 illustrates an example of an alkali beam cell system 50 in accordance with an aspect of the invention. The system 50 includes an alkali beam cell 52. The alkali beam cell 52 can be a reversible alkali beam cell, such as the alkali beam cells 10 and 20 described above in the examples of FIGS. 1 and 2. Therefore, reference is to be made to the examples of FIGS. 1 and 2 in the following description of the example of FIG. 3.

The alkali beam cell 52 includes a first chamber 54 and a second chamber 56. In the example of FIG. 3, a predetermined amount of an alkali metal 58, such as Cs, has been deposited onto the inner surface of an end-wall of the first chamber 54. Accordingly, as demonstrated in the example of FIG. 3, the first chamber 54 can correspond to a reservoir chamber and the second chamber 56 can correspond to a detection chamber. In addition, the alkali beam cell 52 also includes an aperture section 60 that couples the first and second chambers 54 and 56 together. In the example of FIG. 3, the aperture section 60 includes a plurality of tubes 62 that are arranged substantially similar to the tubes 36 described above in the example of FIG. 2. However, similar to as described above, the tubes 62 are not limited to being arranged in a straight and parallel manner with respect to each other and to a central axis that extends through both the first and second chambers 54 and 56.

The system 50 also includes a plurality of control components 64 which, along with the alkali beam cell 52, could be implemented in an alkali beam atomic clock system. Specifically, the control components 64 include a first heat source 66, demonstrated as "HEAT SOURCE A/B", a second heat source 68, demonstrated as "HEAT SOURCE A", and a third heat source 70, demonstrated as "HEAT SOURCE B". The first heat source 66 is configured to apply heat to the aperture section 60. As an example, the first heat source 66 can be configured to substantially surround the aperture section 60 to apply heat directed at the tubes 62. The second heat source 68 and the third heat source 70 are configured to apply heat to the side-walls of the first chamber 54 and the second chamber 56, respectively. As an example, the second heat source 68 can be configured to provide heat to the first chamber 54 upon the first chamber 54 being configured as the reservoir chamber and the third heat source 70 can be configured to provide heat to the second chamber 56 upon the second chamber 56 being configured as the reservoir chamber. For example, the heat sources 66, 68, and 70 can be configured as resistive heat sources that could be disposed around or substantially within the glass side-walls of the aperture section 60, the first chamber 54, and the second chamber 56, respectively. Accordingly, the first, second, and third heat sources 66, 68, and 70 can be configured to provide the requisite heat to evaporate the alkali metal 58 and to provide the pressure difference across the alkali beam cell 52 for the generation of the alkali beam, and thus a frequency reference based on the alkali beam.

The control components 64 also include first signal pump and interrogation components 72, demonstrated as "SIGNAL PUMP/INTERROGATION COMPONENTS A", and include second signal pump and interrogation components 74, demonstrated as "SIGNAL PUMP/INTERROGATION COMPONENTS B". The control components 64 further include first beam detection components 76, demonstrated as "BEAM DETECTION COMPONENTS A", and second beam detection components 78, demonstrated as "BEAM DETECTION COMPONENTS B".

The first signal pump and interrogation components 72 and the first beam detection components 76 are arranged substantially near the second chamber 56, and the second signal pump and interrogation components 74 and the second beam detection components 78 are arranged substantially near the first chamber 54. Therefore, upon the second chamber 56 being configured as the detection chamber, the first signal pump and interrogation components 72 can be configured to provide optical energy into the second chamber 56 to pump the evaporated particles of the alkali metal 58 to a desired hyperfine state to prepare the alkali beam for interrogation. The first signal pump and interrogation components 72 can also be configured to provide one or more interrogation signals, such as microwave signals, to the alkali beam in the second chamber 56. The first beam detection components 76 can thus be configured to monitor fluorescent emission or absorption properties of the alkali beam in response to the interrogation signals, such as via a photodetector, to tune an oscillator (not shown) that sets the frequency of the interrogation signals. Accordingly, upon locking the frequency of the oscillator with a hyperfine transition frequency associated with the emitted/absorbed radiation of the evaporated alkali metal, the stable frequency reference of the alkali beam can be set.

The above description regarding the first signal pump and interrogation components 72 and the first beam detection components 76 likewise applies to the second signal pump and interrogation components 74 and the second beam detection components 78 upon the first chamber 54 being configured as the detection chamber. Accordingly, the frequency reference of the alkali beam can be set regardless of the roles of the first and second chambers 54 and 56 with respect to reservoir and detection chambers, respectively. Therefore, as demonstrated in the example of FIG. 3, as well as FIGS. 4-6 below, the designation of "A" and "B" correspond to the respective roles of the first and second chambers 54 and 56. Specifically, the components designated "A" operate while the first chamber 54 is configured as the reservoir chamber and the second chamber 56 is configured as the detection chamber, and the components designated "B" operate while the second chamber 56 is configured as the reservoir chamber and the first chamber 54 is configured as the detection chamber. Thus, as demonstrated in the example of FIG. 3, the first heat source 66 can be configured to operate during both time periods (i.e., at both respective roles of the first and second chambers 54 and 56).

Figure 4:
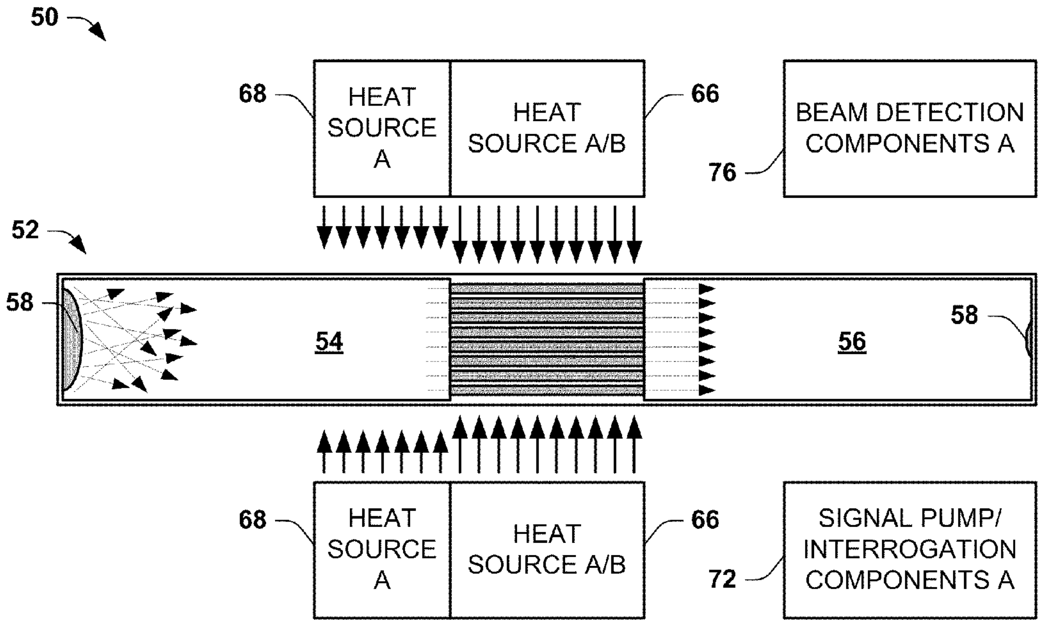
FIG. 4 illustrates another example of an alkali beam cell system in accordance with an aspect of the invention.

FIG. 4 illustrates another example of the alkali beam cell system 50 in accordance with an aspect of the invention. In the example of FIG. 4, like reference numbers are used as those in the example of FIG. 3. Therefore, reference is to be made to the example of FIG. 3 in the following description of the example of FIG. 4.

The example of FIG. 4 demonstrates operation of the alkali beam cell 52 in the first time period, such that the first chamber 54 is configured as the reservoir chamber and the second chamber 56 is configured as the detection chamber. Therefore, the components designated "A" are operational in the example of FIG. 4. Specifically, the first heat source 66 provides heat to the aperture section 60 and the second heat source 68 provides heat to the first chamber 54, demonstrated in the example of FIG. 4 by the arrows emanating from the first and second heat sources 66 and 68. In the example of FIG. 4, the arrows emanating from the second heat source 68 are shorter to depict that the aperture section 60 is the hottest portion of the alkali beam cell 52.

In response to the heat provided by the first and second heat sources 66 and 68, a pressure difference is generated in the second chamber 56 relative to the first chamber 54, and the alkali metal 58 is demonstrated in the example of FIG. 4 as evaporating. The evaporated alkali metal particles, demonstrated by the arrows emanating from the alkali metal 58, are thus caused to migrate along the alkali beam cell 52 due to the pressure difference induced by the first and second heat sources 66 and 68. In addition, the configuration of the aperture section 60 can control a velocity profile of the alkali metal particles in response to the pressure difference. This is demonstrated in the example of FIG. 4 based on the straight dotted arrows through the tubes 62 of the aperture section 60. In the example of FIG. 4, a majority of the alkali metal 58 is demonstrated as being deposited on the end-wall of the first chamber 54. However, the example of FIG. 4 also demonstrates that a small portion of the alkali metal 58 has collected on the end-wall of the second chamber 56 in response to the evaporation and migration of the particles of the alkali metal 58.

Based on the migration of the particles of the alkali metal 58 to the end-wall of the second chamber 56, the first signal pump and interrogation components 72 can be configured to pump the particles to a desired hyperfine state. The first signal pump and interrogation components 72 can also be configured to interrogate the resultant alkali beam with a microwave signal and to lock the frequency of an associated microwave oscillator to a hyperfine transition frequency associated with the particles of the alkali metal 58 based on the optical detection performed by the first beam detection components 76, as described above in the example of FIG. 3. Therefore, the example of FIG. 4 demonstrates the manner in which the frequency reference, such as can be implemented in an alkali beam atomic clock, can be generated during a first time period.

Figure 5:
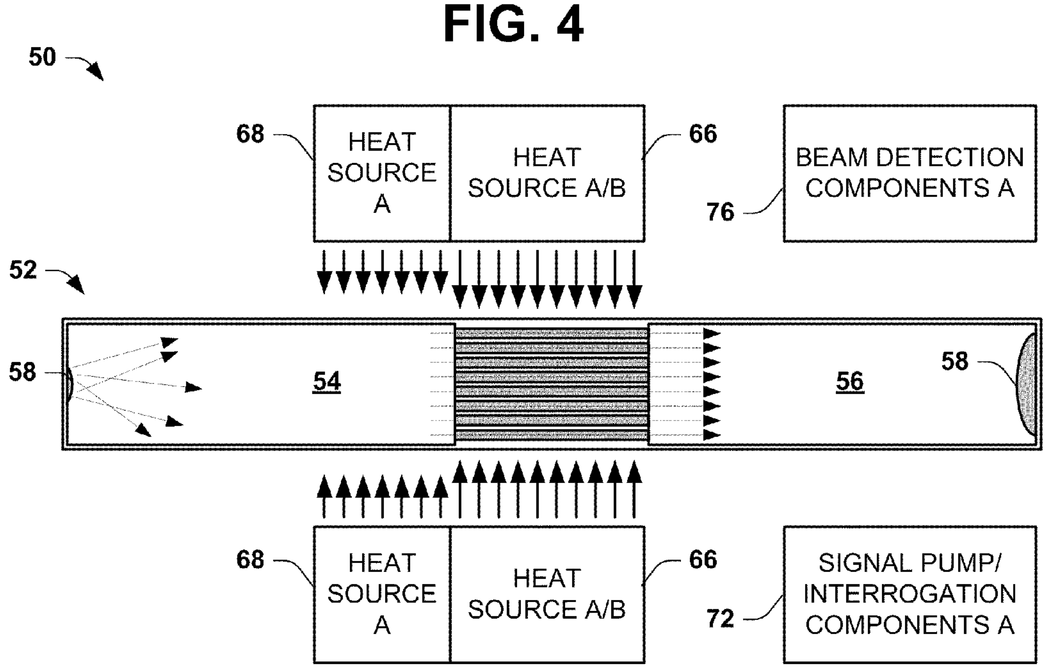
FIG. 5 illustrates yet another example of an alkali beam cell system in accordance with an aspect of the invention.

FIG. 5 illustrates another example of the alkali beam cell system 50 in accordance with an aspect of the invention. In the example of FIG. 5, like reference numbers are used as those in the examples of FIGS. 3 and 4. Therefore, reference is to be made to the examples of FIGS. 3 and 4 in the following description of the example of FIG. 5.

The example of FIG. 5 is depicted as substantially similar to the example of FIG. 4. Specifically, the example of FIG. 5 demonstrates operation of the alkali beam cell 52 in the first time period, such that the first chamber 54 is configured as the reservoir chamber and the second chamber 56 is configured as the detection chamber. Therefore, the components designated "A" are still operational in the example of FIG. 5. However, in the example of FIG. 5, the alkali metal 58 that is deposited on the end-wall of the first chamber 54 is almost all depleted. In other words, most of the alkali metal 58 has collected at the end-wall of the second chamber 56. Therefore, the example of FIG. 5 depicts the alkali beam cell system 50 near the end of the first time period.

Because the amount of the alkali metal 58 is almost all depleted from the first chamber 54, and thus the reservoir chamber, the amount of particles of the alkali metal 58 that is vaporized and migrating from the first chamber 54 to the second chamber 56 can be significantly diminished. This is demonstrated in the example of FIG. 5 based on a reduced quantity of arrows emanating from the alkali metal 58 in the first chamber 54 relative to that demonstrated in the example of FIG. 4. As a result, the intensity of the emitted/absorbed signal detected by the first beam detection components 76 can be substantially reduced. Accordingly, the first beam detection components 76 can be configured to identify when the first time period is about to expire, such that an associated controller (not shown) can be configured to begin the second time period at an appropriate time to switch the roles of the first and second chambers 54 and 56. As an example, the first beam detection components 76 can be configured to provide a signal to the associated controller in response to the intensity of the emitted/absorbed signal being reduced below a threshold. Thus, the associated controller can be configured to reverse the roles of the first and second chambers 54 and 56 to be detection and reservoir chambers, respectively. Accordingly, the first time period concludes and the second time period begins.

Figure 6:
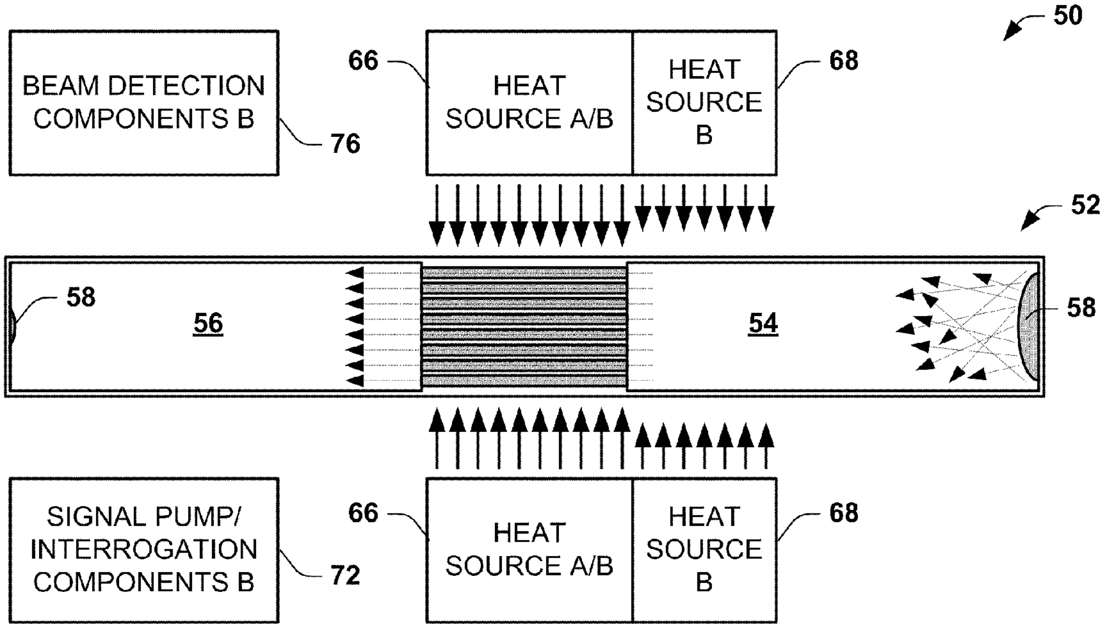
FIG. 6 illustrates yet a further example of an alkali beam cell system in accordance with an aspect of the invention.

FIG. 6 illustrates another example of the alkali beam cell system 50 in accordance with an aspect of the invention. In the example of FIG. 6, like reference numbers are used as those in the examples of FIGS. 3-5. Therefore, reference is to be made to the examples of FIGS. 3-5 in the following description of the example of FIG. 6.

The example of FIG. 6 demonstrates operation of the alkali beam cell 52 in the second time period, such that the second chamber 56 is configured as the reservoir chamber and the first chamber 54 is configured as the detection chamber. Therefore, the components designated "B" are operational in the example of FIG. 6. Specifically, the first heat source 66 provides heat to the aperture section 60 and the third heat source 70 provides heat to the second chamber 56, demonstrated in the example of FIG. 6 by the arrows emanating from the first and third heat sources 66 and 70. In the example of FIG. 6, similar to as described above in the example of FIG. 4, the arrows emanating from the third heat source 70 are shorter to depict that the aperture section 60 is the hottest portion of the alkali beam cell 52.

In response to the heat provided by the first and third heat sources 66 and 70, a pressure difference is generated in the first chamber 54 relative to the second chamber 56, and the alkali metal 58 is demonstrated in the example of FIG. 6 as evaporating. Therefore, similar to as described above in the example of FIG. 4, the evaporated alkali metal particles are thus caused to migrate along the alkali beam cell 52 due to the pressure difference induced by the first and third heat sources 66 and 70. In the example of FIG. 6, a majority of the alkali metal 58 is demonstrated as being deposited on the end-wall of the second chamber 56. However, the example of FIG. 6 also demonstrates that a small portion of the alkali metal 58 has collected on the end-wall of the first chamber 54 in response to the evaporation and migration of the particles of the alkali metal 58.

Based on the migration of the particles of the alkali metal 58 to the end-wall of the first chamber 54, the second signal pump and interrogation components 74 can be configured to pump the particles to a desired hyperfine state. The second signal pump and interrogation components 74 can also be configured to interrogate the resultant alkali beam with a microwave signal and to lock the frequency of an associated microwave oscillator based on the optical detection performed by the second beam detection components 78, as described above in the examples of FIGS. 3 and 4. Therefore, the example of FIG. 6 demonstrates the manner in which the frequency reference, such as can be implemented in an alkali beam atomic clock, can be generated during a second time period.

It is to be understood that the system 50 is not intended to be limited to the examples of FIGS. 3-6. As an example, the first, second, and third heat sources 66, 68, and 70 are not intended to be limited to the position, direction, or manner of heating the alkali beam cell 52. For example, the second heat source 68 could be configured to still provide heat during the second time period and the third heat source 70 could be configured to still provide heat during the first time period. The heat sources 68 and 70 could be variable based on the time periods. As another example, the alkali beam cell 52 could be physically moved or rotated to change the manner in which it is heated. For example, the alkali beam cell 52 could be oriented 180° at a transition between the first and second time periods. Therefore, the system 50 could include only a single set of heat sources, signal pump and interrogation components, and beam detection components. Furthermore, it is to be understood that the manner in which the alkali beam is generated in the detection chamber and the manner in which the frequency reference is obtained is not limited to the examples of FIGS. 3-6, and could instead incorporate any of a variety of other techniques for obtaining the frequency reference. Accordingly, the alkali beam cell system 50 can be configured in any of a variety of ways.

Figure 7:
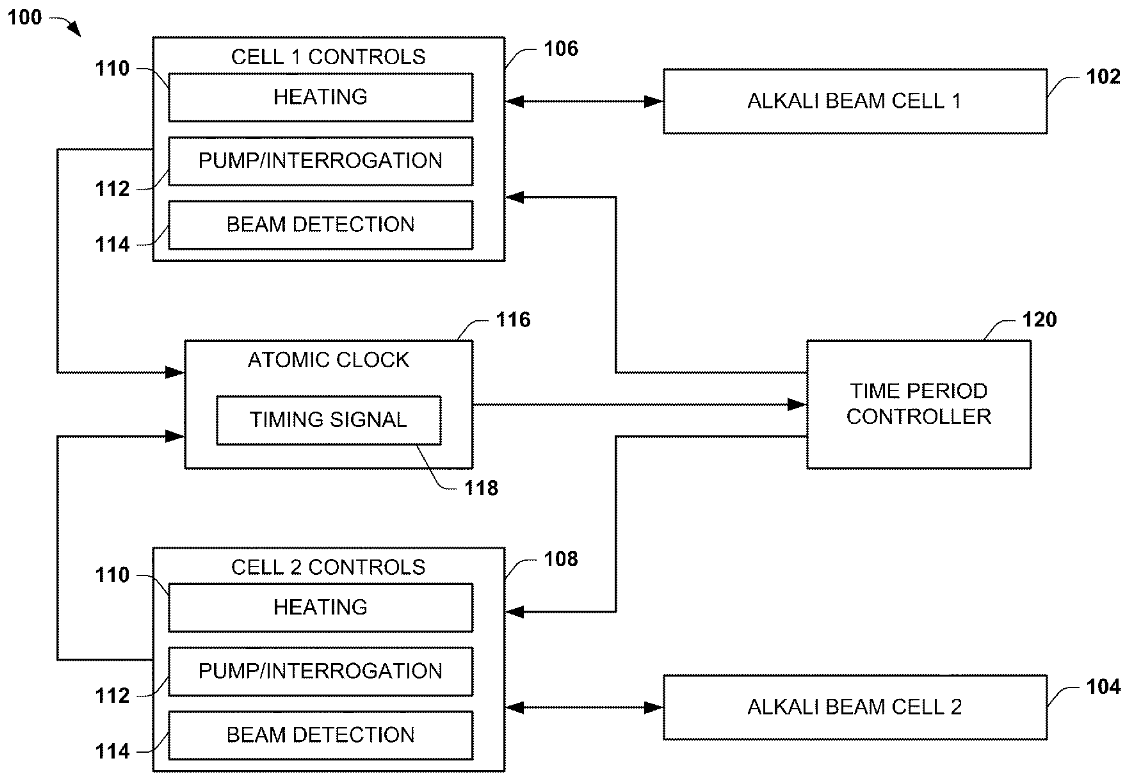
FIG. 7 illustrates an example of a diagram of an alkali beam atomic clock system in accordance with an aspect of the invention.

FIG. 7 illustrates an example of a diagram of an alkali beam atomic clock system 100 in accordance with an aspect of the invention. The system 100 can be configured to provide a very accurate timing reference, such as could be implemented on a satellite or other application. The system 100 includes a first alkali beam cell 102 and a second alkali beam cell 104. Each of the first and second alkali beam cells 102 and 104 can be configured substantially similar to the alkali beam cells 10, 20, and 52 described above in the examples of FIGS. 1-6. Therefore, the first and second alkali beam cells 102 and 104 can each be configured as reversible, such that each of the first and second alkali beam cells 102 and 104 can include first and second chambers that can each be configured as reservoir and detection chambers, respectively, during different time periods.

The system 100 includes a first cell control system 106 that is configured to control the first alkali beam cell 102 and a second cell control system 108 that is configured to control the second alkali beam cell 104. Each of the first and second cell control systems 106 and 108 include heating controls 110, pump/interrogation controls 112, and beam detection controls 114. As an example, each of the heating controls 110 can be configured as at least one of the first, second, and third heat sources 66, 68, and 70 in the examples of FIGS. 3-6. Likewise, each of the pump/interrogation controls 112 can be configured substantially similar to the first and second pump and interrogation components 72 and 74, and each of the beam detection controls 114 can be configured substantially similar to the first and second beam detection components 76 and 78. Accordingly, the first alkali beam cell 102 and the first cell control system 106, as well as the second alkali beam cell 104 and the second cell control system 108, can be configured substantially similar to the alkali beam cell system 50 in the examples of FIGS. 3-6.

The system 100 also includes an atomic clock 116. The atomic clock 116 is configured to receive a frequency reference signal from each of the first and second cell control systems 106 and 108. Therefore, the atomic clock 116 can be configured to provide a very accurate and very long-life timing signal 118. As an example, the frequency reference signals provided from each of the first and second cell control systems 106 and 108 can be substantially synchronized with respect to each other, such that the atomic clock 116 can provide the timing signal 118 from either of the frequency reference signals or from both of them concurrently in a redundant manner. Accordingly, the timing signal 118 can be implemented in any of a variety of applications in which accurate and long-term timing is necessary.

As described above, each of the first and second alkali beam cells 102 and 104 are reversible, such that they can continue to be implemented by the respective first and second cell control systems 106 and 108 to obtain the frequency reference substantially indefinitely. However, upon one of the first and second alkali beam cells 102 and 104 switching from the first time period to the second time period, the frequency reference signal from the respective one of the first and second alkali beam cells 102 and 104 can be interrupted, such that the frequency reference may need to be reacquired from the respective one of the first and second alkali beam cells 102 and 104 upon the time period transition. Accordingly, the first and second alkali beam cells 102 and 104 can be configured to be out-of-phase with each other with respect to the time periods associated with the roles of their respective first and second chambers.

For example, the first chamber of the first alkali beam cell 102 can be configured as the reservoir chamber during a first time period and as the detection chamber during a second time period. Similarly, the first chamber of the second alkali beam cell 104 can be configured as the reservoir chamber during a third time period and as the detection chamber during a fourth time period. The third time period can overlap a portion of each of the first and second time periods and the fourth time period can overlap the remaining portion of the first and second time periods. As a result, the system 100 can be configured to reverse the roles of the first and second chambers of only one of the first and second alkali beam cells 102 and 104 at a given instance, such that a frequency reference signal is always provided to the atomic clock 116 at any given time. As such, during the time at which one of the alkali beam cells 102 and 104 reverses and reacquires its respective frequency reference, the atomic clock can maintain the timing signal 118 accurately and uninterrupted based on the frequency reference signal provided from the other of the alkali beam cells 102 and 104.

The system 100 further includes a clock controller 120. The clock controller 120 is configured to control the transitions of the time periods (i.e., reversals) of the first and second alkali beam cells 102 and 104. In the example of FIG. 7, the atomic clock 116 is configured to provide a timing reference to the clock controller 120, such that the clock controller 120 can provide a command to one of the first and second cell control systems 106 and 108 to reverse the respective one of the alkali beam cells 102 and 104. As another example, the clock controller 120 can receive a signal from one of the first and second cell control systems 106 and 108, such as based on a fluorescent emission/absorption signal being reduced to less than a threshold, such as described above in the example of FIG. 5. Accordingly, based on the controlled and staggered transition of the time periods for each of the first and second alkali beam cells 102 and 104, the atomic clock 116 can maintain a very accurate timing signal 118 substantially consistently and indefinitely.

It is to be understood that the system 100 is not intended to be limited to the example of FIG. 7. As an example, the system 100 is not limited to the use of two alkali beam cells, but could include any number of alkali beam cells and associated cell control systems that each provide frequency references to the atomic clock 116. As another example, the clock controller 120 can be incorporated into one or both of the first and second cell control systems 106 and 108. Accordingly, the alkali beam atomic clock system 100 can be configured in any of a variety of ways.

Figure 8:
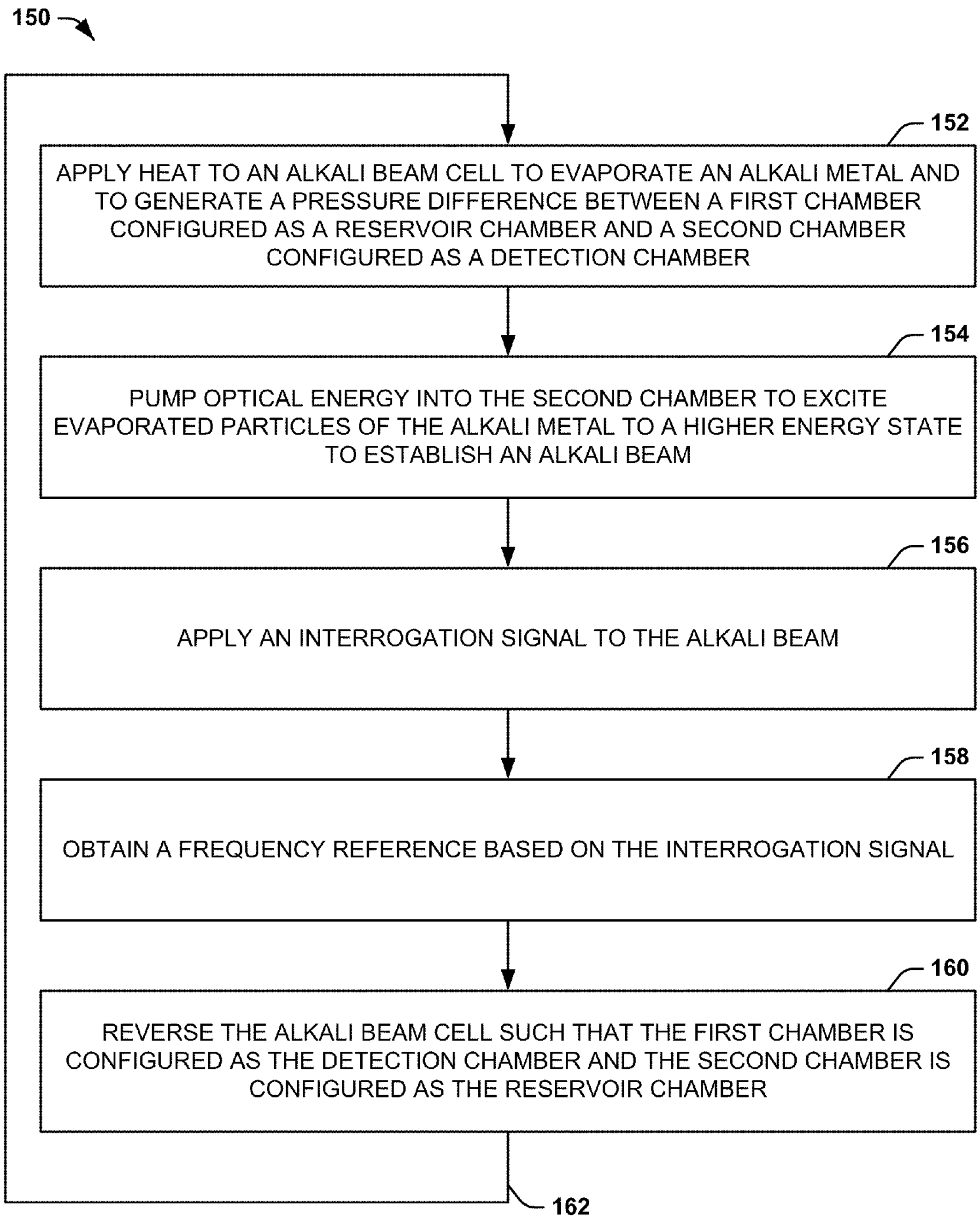
FIG. 8 illustrates an example of a method for controlling an alkali beam atomic clock in accordance with an aspect of the invention.

In view of the foregoing structural and functional features described above, a methodology in accordance with various aspects of the present invention will be better appreciated with reference to FIG. 8. While, for purposes of simplicity of explanation, the methodologies of FIG. 8 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates an example of a method 150 for controlling an alkali beam atomic clock in accordance with an aspect of the invention. At 152, heat is applied to an alkali beam cell to evaporate an alkali metal and to generate a pressure difference between a first chamber configured as a reservoir chamber and a second chamber configured as a detection chamber. The first and second chambers can be interconnected by an aperture section. The aperture section can include a hole, or a plurality of tubes, which can be straight and parallel, could be tapered, or could be non-linear and/or not parallel with an axis that extends along the first and second chambers. The alkali metal is evaporated in the first chamber and is migrated to the second chamber. The evaporation can result from the heat and the migration can result based on the pressure difference. The alkali metal can be Cesium (Cs). The alkali metal collects in the second chamber as it evaporates and migrates. The alkali metal can collect at an end-wall of the second (i.e., detection) chamber based on the migration.

At 154, optical energy is pumped into the second chamber to excite the evaporated particles of the alkali metal to a desired hyperfine state to prepare the alkali beam for interrogation. At 156, an interrogation signal is applied to the alkali beam. The beam can be interrogated by one or more signals, such as microwave signals, to result in emitted or absorbed fluorescent optical energy that is detected. At 158, a frequency reference is obtained based on the interrogation signal. The detected emitted or absorbed fluorescent optical energy can be used to set a frequency of an oscillator that can correspond to the frequency reference based on locking the frequency of the oscillator with a hyperfine transition frequency associated with the emitted/absorbed radiation of the evaporated alkali metal.

At 160, the alkali beam cell can be reversed such that the first chamber is configured as the detection chamber and the second chamber is configured as the reservoir chamber. The reversal can occur based on most of the alkali metal being disposed in the second chamber. The reversal can be in response to the emitted/absorbed optical energy intensity dropping below a threshold, or in response to a predetermined time. The method 150 thus repeats, as demonstrated in the example of FIG. 8 by the arrow at 162. As a result, the alkali beam cell can provide the frequency response in a stable manner and substantially indefinitely.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An alkali beam cell system comprising a reversible alkali beam cell, the reversible alkali beam cell comprising:

a first chamber configured as a reservoir chamber configured to evaporate an alkali metal during a first time period and as a detection chamber configured to collect the evaporated alkali metal during a second time period;

a second chamber configured as the detection chamber during the first time period and as the reservoir chamber during the second time period; and an aperture interconnecting the first and second chambers and through which the alkali metal is allowed to diffuse.

2. The system of claim 1, wherein the aperture is configured as a plurality of substantially parallel tubes each having a first opening that is coupled to the first chamber and a second opening that is coupled to the second chamber.

3. The system of claim 2, wherein each of the plurality of substantially parallel tubes is configured as tapered from a first size to a second size to achieve a longitudinally dependent cross-section, such that a first of the first openings is of the first size and is adjacent to a plurality of first openings being of the second size and a second of the first openings is of the second size and is adjacent to a plurality of first openings being of the first size.

4. The system of claim 2, wherein each of the plurality of substantially parallel tubes is configured as having an axis that is substantially straight and not parallel with respect to a central axis of the first chamber and the second chamber.

5. The system of claim 2, wherein each of the plurality of substantially parallel tubes is configured as having an axis that is substantially non-linear.

6. The system of claim 1, further comprising a controller configured to reverse the configuration of the first chamber and the second chamber with respect to the reservoir chamber and the detection chamber at the end of each of the first time period and the second time period.

7. The system of claim 6, wherein the controller is configured to reverse the configurations of the first and second chambers in response to a detected fluorescent signal in the detection chamber having an intensity that is reduced below a threshold.

8. The system of claim 6, wherein the controller is configured to reverse the configurations of the first and second chambers based on reversing a heating configuration of the alkali beam cell to reverse a pressure difference between the first and second chambers.

9. An alkali beam atomic clock comprising the alkali beam cell system of claim 1.

10. The alkali beam atomic clock of claim 9, wherein the reversible alkali beam cell is a first reversible alkali beam cell, the alkali beam atomic clock further comprising:

a second reversible alkali beam cell; and a clock controller configured to obtain a frequency reference from one of the first and second reversible alkali beam cells and to reverse the other of the first and second reversible alkali beam cells upon a substantially complete evaporation of the alkali metal in the reservoir chamber of the other of the first and second reversible alkali beam cells at a given time, such that the frequency reference is substantially uninterrupted.

11. An alkali beam atomic clock system comprising:

a reversible alkali beam cell comprising a first chamber, a second chamber, and an aperture interconnecting the first and second chambers and through which an alkali metal is allowed to diffuse, the first chamber being configured as a reservoir chamber configured to evaporate the alkali metal and the second chamber being configured as a detection chamber being configured to collect the evaporated alkali metal during a first time period, the second chamber being configured as the reservoir chamber and the first chamber being configured as the detection chamber during a second time period;

at least one heating element configured to heat the reservoir chamber during each of the first and second time periods; and a clock controller configured to generate a clock signal that is locked to a hyperfine transition frequency of the evaporated alkali metal in the detection chamber.

12. The system of claim 11, wherein the clock controller is configured to reverse the configuration of the first and second chambers with respect to the reservoir and detection chambers at the end of each of the first time period and the second time period.

13. The system of claim 12, wherein the clock controller is configured to reverse the configuration in response to a detected fluorescent signal in the detection chamber having an intensity that is reduced below a threshold.

14. The system of claim 12, wherein the clock controller is configured to reverse the configuration based on reversing a heating configuration of the first and second reversible alkali beam cells to reverse a pressure difference between the first and second chambers.

15. The system of claim 11, wherein the reversible alkali beam cell is a first reversible alkali beam cell, the alkali beam atomic clock further comprising a second reversible alkali beam cell, and wherein the clock controller is further configured to generate the clock signal from one of the first and second reversible alkali beam cells and to reverse the other of the first and second reversible alkali beam cells upon a substantially complete evaporation of the alkali metal in the reservoir chamber of the other of the first and second reversible alkali beam cells at a given time, such that the clock signal is substantially uninterrupted.

16. The system of claim 11, wherein the reversible alkali beam cell is a first reversible alkali beam cell, the alkali beam atomic clock further comprising a second reversible alkali beam cell comprising a third chamber, a fourth chamber, and a second aperture interconnecting the third and fourth chambers and through which the alkali metal is allowed to diffuse, the third chamber being configured as a second reservoir chamber configured to evaporate the alkali metal and the fourth chamber being configured as a second detection chamber being configured to collect the evaporated alkali metal during a third time period, the second chamber being configured as the second reservoir chamber and the first chamber being configured as the second detection chamber during a fourth time period, the third time period overlapping a portion of each of the first and second time periods and the fourth time period overlapping a remaining portion of each of the first and second time portions.

17. The system of claim 16, wherein the clock controller is configured to reverse the configuration of the first and second chambers at the end of each of the first time period and the second time period, and to reverse the configuration of the third and fourth chambers at the end of each of the third time period and the fourth time period, the system further comprising:

a set of detection components configured to detect one of fluorescent emission and fluorescent absorption in both of the first and second detection chambers during the first, second, third, and fourth time periods to provide an uninterrupted frequency reference that is based on the hyperfine transition frequency of the evaporated alkali metal throughout the first, second, third, and fourth time periods.

18. A method for controlling an alkali beam atomic clock, the method comprising:

applying heat to an alkali beam cell to evaporate an alkali metal and to generate a pressure difference between a first chamber configured as a reservoir chamber and a second chamber configured as a detection chamber;

pumping optical energy into the second chamber to excite the evaporated particles of the alkali metal to a desired hyperfine state to establish an alkali beam;

applying an interrogation signal to the alkali beam;

obtaining a frequency reference based on the interrogation signal;

reversing the alkali beam cell such that the first chamber is configured as the detection chamber and the second chamber is configured as the reservoir chamber; and repeating the steps of applying heat, pumping optical energy, applying the interrogation signal, and obtaining the frequency reference.

19. The method of claim 18, wherein reversing the alkali beam cell comprises reversing the alkali beam cell in response to a detected fluorescent signal in the detection chamber having an intensity that is reduced below a threshold.

20. The method of claim 18, wherein reversing the alkali beam cell comprises reversing a heating configuration of the alkali beam cell to reverse a pressure difference between the first and second chambers.

21. The method of claim 18, wherein reversing the alkali beam cell comprising reversing the alkali beam cell based on an alkali metal deposited in the reservoir chamber being substantially completely evaporated and collected in the detection chamber.

22. The method of claim 18, wherein applying heat to the alkali beam cell comprises applying heat to a first alkali beam cell comprising the first and second chambers and applying heat to a second alkali beam cell to evaporate an alkali metal and to generate a pressure difference between a third chamber configured as a second reservoir chamber and a fourth chamber configured as a second detection chamber, and wherein the frequency reference is a first frequency reference, the method further comprising:

pumping optical energy into the fourth chamber to excite the evaporated particles of the alkali metal to a desired hyperfine state to establish a second alkali beam;

applying a second interrogation signal to the second alkali beam;

obtaining a second frequency reference based on the second interrogation signal, the second frequency reference being approximately equal to the first frequency reference;

reversing the second alkali beam cell such that the third chamber is configured as the second detection chamber and the fourth chamber is configured as the second reservoir chamber; and repeating the steps of applying heat, pumping optical energy, applying the second interrogation signal, and obtaining the second frequency reference.

23. The method of claim 18, wherein the reversible alkali beam cell is a first reversible alkali beam cell, the method further comprising:

obtaining the frequency reference from one of the first reversible alkali beam cell and a second reversible alkali beam cell; and reversing the other of the first and second reversible alkali beam cells upon a substantially complete evaporation of the alkali metal in the reservoir chamber of the other of the first and second reversible alkali beam cells at a given time, such that the frequency reference is substantially uninterrupted.

* * * * *